United States Patent [19]

Thomas

[11] B 3,986,108
[45] Oct. 12, 1976

[54] APPARATUS AND METHOD FOR MEASURING CAPACITANCE

[75] Inventor: Edwin Paul Thomas, Brick Town, N.J.

[73] Assignee: Bell Telephone Laboratories, Incorporated, Murray Hill, N.J.

[22] Filed: Jan. 10, 1975

[21] Appl. No.: 540,218

[44] Published under the second Trial Voluntary Protest Program on February 10, 1976 as document No. B 540,218.

[52] U.S. Cl. ............................ 324/60 C; 324/57 R; 324/59
[51] Int. Cl.² ........................................ G01R 27/26
[58] Field of Search ............. 324/60 C, 60 R, 57 R, 324/59

[56] References Cited
UNITED STATES PATENTS 3,530,379  9/1970  Demerliac ........................ 324/60 R
3,668,523  6/1972  Kuhn ............................ 324/60 C X
3,761,805  9/1973  Dornbeger ...................... 324/60 C
3,761,812  9/1973  Plake ........................... 324/57 R X Primary Examiner—Stanley T. Krawczewicz
Attorney, Agent, or Firm—Thomas Stafford

[57] ABSTRACT

Capacitance of a network-under-evaluation is measured by employing a ramp signal technique. A periodic ramp signal having a known slope and equal positive and negative amplitudes is supplied to the network. Then, a measure of the current developed in the network is obtained at the instant the ramp signal attains a prescribed amplitude value. The measured current value is utilized to compute the desired capacitance value.

3 Claims, 3 Drawing Figures

APPARATUS AND METHOD FOR MEASURING CAPACITANCE

BACKGROUND OF THE INVENTION

This invention relates to impedance measurement arrangements and, more particularly, to a method and apparatus for measuring capacitance.

Numerous techniques are known in the art for obtaining capacitance measurements. For example, bridge circuits which include either manual or automatic balancing arrangements have been employed for this purpose. Bridge circuits which employ manual balancing are undesirable for use in automatic systems. Bridge circuits which employ automatic balancing are typically complex and expensive. Therefore, they are unattractive for use in automated systems from an economics standpoint.

More recently, capacitance measurements have been made by employing a periodic ramp signal having a known slope which is supplied to a network including an unknown capacitance. Typically, the capacitance to be measured is connected in a circuit to form a differentiator. Then, the output voltage from the differentiator is detected and measured. For a "pure" capacitance, the differentiator output is a square wave having an amplitude proportional to the unknown capacitance value. This prior ramp signal technique yields satisfactory results for measurements of pure capacitance values. However, unsatisfactory results are obtained when measuring unknown capacitance values of networks including other impedance components, for example, series resistance, series inductance and shunt resistance. This is because the current developed in such networks in response to the ramp signal does not have a constant amplitude. Thus, the prior known ramp signal measurement technique is unacceptable for obtaining representative capacitance measurements of telephone subscriber loops and the like which include impedance components in addition to capacitance.

SUMMARY OF THE INVENTION

These and other problems are resolved in accordance with the inventive principles to be described herein in apparatus and a method for obtaining capacitance measurements by employing a periodic ramp signal having a predetermined slope and by obtaining a measure of current passing through a network-under-evaluation in response to the ramp signal at the instant the ramp signal passes a prescribed amplitude value.

In one embodiment of the invention, a ramp signal having a known slope and equal negative and positive amplitude values is supplied to a network-under-evaluation. Then, a measure is obtained of the amplitude of the total current passing through the network-under-evaluation at the instant the ramp signal passes through zero amplitude. This current measurement is achieved by employing a zero crossing detector and a sample and hold circuit. The zero crossing detector yields an output pulse signal at the instant that the ramp signal passes zero amplitude. In turn, the zero crossing detector output triggers the sample and hold circuit to sample the amplitude of a signal proportional to the current passing through the network-under-evaluation. The amplitude of the sampled signal is measured and is utilized to determine the value of the unknown capacitance of the network-under-evaluation.

Thus, a measure of the capacitance of a network-under-evaluation is obtained by supplying a ramp signal having a predetermined slope to a network-under-evaluation, measuring the current flowing in the network-under-evaluation at the instant that the amplitude passes through a prescribed value and utilizing the measured current value to compute the capacitance value of the network-under-evaluation.

Automatic range control of the sampled signal amplitude is realized by employing an amplifier having controllable gain. The amplitude of the sampled signal is compared to predetermined reference potentials representative of upper and lower limits of a desired range to determine whether the amplitude is within range, above range or below range. If the amplitude is above or below range, the amplifier gain is adjusted to bring the amplitude within range. This gain adjustment is realized by controllably supplying a pulsating signal having a period equal to the period of the ramp signal to a counter and converting output signals from the counter to sequential control signals corresponding to gain increments of the amplifier. Controllable switching devices respond to the control signals to adjust sequentially the amplifier gain. In operation, the pulsating signal is supplied to the counter until the amplifier gain is adjusted so that the sampled signal amplitude is within range. Once the amplitude is within the desired range, the pulsating signal is inhibited and the count in the counter remains fixed.

DETAILED DESCRIPTION

It is well known in the art that for a pure capacitance, $Cx$, $$Ic = Cx \frac{dVs}{dt}. \quad (1)$$

Thus, by applying periodic ramp signal $Vs$ having known slope $m = dVs/dt$ and equal positive and negative amplitudes, current $Ic$ flowing through capacitor $Cx$ is a rectangular pulse waveform having a constant amplitude and a period equal to that of ramp signal $Vs$. Heretofore, the value of capacitance $Cx$ was obtained by rectifying current $Ic$ and measuring the average value. The measured current value coupled with the slope of the applied waveform yields the desired capacitance value, namely, $$Cx = \frac{Ic}{m}. \quad (2)$$

One known prior arrangement for obtaining a measure of pure capacitance values is disclosed in U.S. Pat. No. 3,530,379, issued Sept. 22, 1970.

In practice, it is desirable to obtain a measure of the capacitance of networks which may include impedance components in addition to capacitance, for example, resistance and inductance. A telephone subscriber loop is one example of such a network. A subscribed loop includes a subscriber telephone line and a station set. Therefore, the capacitance to be measured is a combination of that contributed by the telephone line and that contributed by the station set ringer.

A telephone subscriber line has impedance components including series resistance, distributed series inductance, and distributed parallel capacitance and resistance. It can be shown that the affect of series inductance on a capacitance value measured by employing the instant measurement technique is or can be made negligible. Moreover, I have observed that the affect of distributed parallel resistance on the measurement is also minimized by obtaining a measure of the current developed in a network-under-evaluation at the instant an applied ramp signal passes through a prescribed amplitude value, for example, zero volts.

Turning now to the station set, it includes an inductance in series with a capacitance and is a load on the telephone subscriber line. The affect of the inductance is greatest at the instant that the applied ramp signal changes slope. The potential developed across the inductance tends to approach zero sometime after the slope changes because the rate of change in the current passing through the inductance tends to become a constant. Therefore, if the period of the applied waveform is chosen to be sufficiently long so that any transients caused by the inductance do not occur near the prescribed amplitude value at which the current measurement is to be made, the affect of the inductance is minimized and may be ignored.

Figure 1:
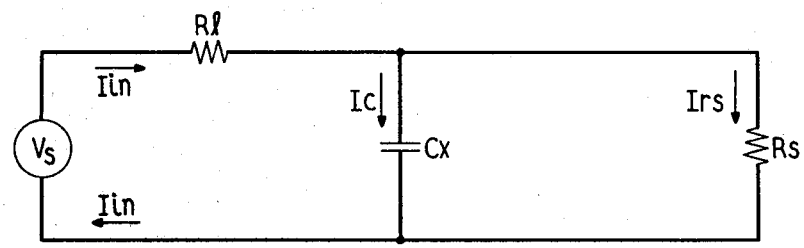
FIG. 1 shows a network useful in describing the invention.

Referring to FIG. 1, a network is shown which for purposes of the instant measurement technique is a lumped impedance approximation of a subscriber line loaded with a station set ringer. Resistance $Rl$ is the series resistance of the line and may have a value up to approximately 2 kilohms, resistance $Rs$ is the parallel resistance of the line, i.e., leakage, and typically has a minimum value of approximately 30 kilohms. Capacitance $Cx$ is the telephone line capacitance plus the station set ringer capacitance. The ringer inductance is not shown.

For a network as shown in FIG. 1, $$Iin = Ic + Irs \tag{3}$$

$$Ic = \left(\frac{Rs}{Rl+Rs}\right) mCx \tag{4}$$

where $$m = \frac{dVs}{dt}$$

and $$Irs = \frac{\left[mt - mCx \left(\frac{Rs}{Rl+Rs}\right) Rl\right] \frac{Rs}{Rl+Rs}}{Rs} \tag{5}$$

for $Vs = mt = 0$, i.e., at the instant $Vs$ crosses zero potential and by substituting equations (3) and (4) in equation (5)

$$Iin = mCx \left(\frac{Rs}{Rl+Rs}\right)^2 \tag{6}$$

Thus, by making a measurement of current $Iin$ at the instant $Vs = 0$, $$Cx = \frac{Iin}{m\left(1+ \frac{Rl}{Rs}\right)^2}. \tag{7}$$

Since $Rl/Rs$ is typically a small value in most instances, the desired capacitance value is simply $$Cx = \frac{Iin}{m} \tag{8}$$

where $Iin$ is measured at $Vs = 0$.

For a so-called worst case subscriber loop, i.e., $Rl = 2$ kilohms and $Rs = 30$ kilohms, the deviation from the actual value of $Cx$ by employing the instant measurement technique is approximately 13 per cent. Evaluations of some prior known capacitance measurement techniques have indicated that the capacitance values measured therewith had substantially greater deviations from the actual values of the capacitances being measured.

Figure 3:
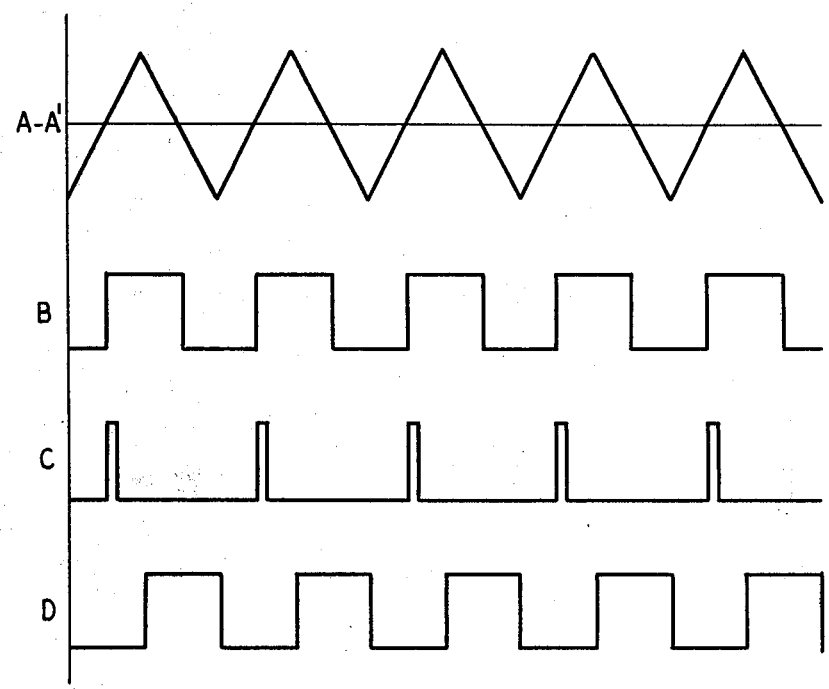
FIG. 3 shows a sequence of waveforms useful in describing the operation of the circuit shown in FIG. 2.
Figure 2:
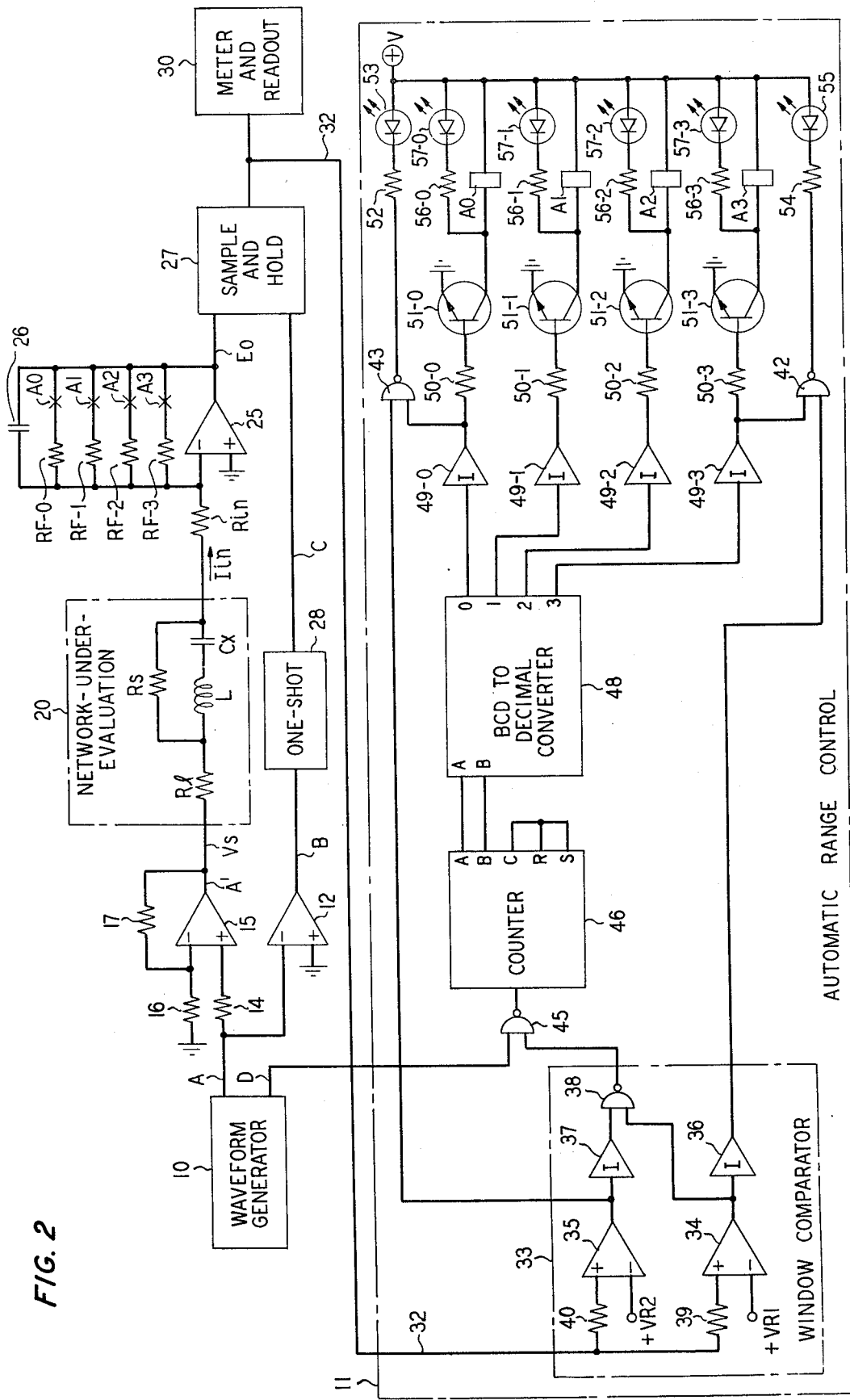
FIG. 2 depicts in simplified form a circuit arrangement illustrating one embodiment of the invention.

FIG. 2 depicts a circuit arrangement illustrating one embodiment of the instant invention. FIG. 3 shows waveforms of signals developed in the circuit of FIG. 2. The waveforms of FIG. 3 are labeled to correspond to the circuit points indicated in FIG. 2.

Accordingly, waveform generator 10 yields a predetermined periodic signal having a triangular waveform, for example, a signal as shown in waveform A of FIG. 3 and a predetermined pulsating signal, for example, a square-wave signal as shown in waveform D of FIG. 3. Such signals having triangular waveforms are commonly referred to as ramp signals. The square-wave output from generator 10 is employed in automatic range control 11 and is discussed below. Generator 10 may be any one of known signal generators capable of generating the desired signals. For example, a function generator of the NE 566 type integrated circuit manufactured by Signetics and commercially available may be employed in well-known fashion for this purpose.

As shown in waveform A of FIG. 3, the ramp signal employed in this example has a known slope and equal positive and negative amplitudes. The frequency of the ramp signal is selected in accordance with a specific range of capacitance values to be measured. If desired, the frequency may be varied depending on the capacitance values being measured. For example, if an unknown capacitance is in the 0.001 microfarad range a 2 Hz signal is satisfactory. If the unknown capacitance value is in a range of 0.0001 microfarads a 20 Hz signal is satisfactory. In general, the frequency is varied so that the current developed in the network-under-evaluation has a desired amplitude range for all capacitance ranges. In this example, the frequency of the applied ramp signal is held constant at 2 Hz and other apparatus is employed for adjusting the measurement range.

Thus, the ramp signal is supplied to zero crossing detector 12 and via resistor 14 to a noninverting input of amplifier 15. Zero crossing detector 12 is a high gain differential amplifier of the operational type which is employed as a comparator. One input of amplifier 12 is held at a reference potential corresponding to a prescribed amplitude level of the ramp signal at which the total current developed in network-under-evaluation 20 is to be measured. In this example, the reference potential is zero volts. The ramp voltage signal is supplied to a second input of amplifier 12. Thus, as shown in waveform B of FIG. 3, the output from amplifier 12 is a square-wave signal having its leading an trailing edges at the zero crossing of the ramp signal.

Amplifier 15 is also a differential amplifier of the high gain type commonly known as an operational amplifier. Amplifier 15 in conjunction with resistors 14, 16 and 17 forms a so-called noninverting amplifier which is employed to adjust the amplitude of the ramp signal output from generator 10. additionally, amplifier 15 provides buffering between generator 10 and circuit-under-evaluation 20. Therefore, the waveform developed at output A' of amplifier 15 is merely an amplitude scaled version of the input, namely, waveform A of FIG. 3.

Ramp signal output V$s$ from amplifier 15 is supplied to network-under-evaluation 20. Network 20 may include, but does not necessarily have to include, impedance components other than pure capacitance C$x$. For example, network 20 may include series resistance R$l$, shunt resistance R$s$ and inductance L. One example of such a network is a telephone subscriber loop including a subscriber line and station set. As described above, the amplitude of current I$in$ developed in and passing through network 20 in response to applied ramp signal V$s$ is related to the value of capacitance C$x$. Thus, a measure of current I$in$ developed in network 20 is obtained at the instant that applied ramp signal V$s$ attains a prescribed amplitude level. In this example, the prescribed amplitude level is zero volts.

To this end, current I$in$ from network 20 is supplied via resistance R$in$ to the inverting input of amplifier 25. Amplifier 25 is also a differential amplifier of the high gain operational type and is employed to yield an output voltage having an amplitude proportional to the magnitude of the current I$in$. Output voltage E$o$ from amplifier 25 is developed in well-known fashion across one of resistors RF-0 through RF-3 inserted in the feedback path between the inverting input and output of amplifier 25. Each of resistors RF-0 through RF-3 is connected in series with a corresponding one of the make contacts of relays A-0 through A-3, respectively. Resistors RF in conjunction with relays A in range control 11 provide range control of the instant capacitance measurement arrangement. Capacitor 26 shunting resistors RF and relay contacts A is employed to filter high frequency signal components, i.e., noise. Although relays are employed to insert a desired one of resistors RF in the feedback path of amplifier 21 other switching devices now known in the art may equally be employed for this purpose, for example, field effect transistors, optical isolators or the like.

As noted above, resistors RF determine the amplitude of output E$o$ from amplifier 25 in well-known fashion. It is necessary to adjust the amplitude of E$o$ because the amplitude of current I$in$ developed in network 20 varies in relationship to the value of unknown capacitance C$x$ and it is desirable to maintain the output E$o$ in a 1 to 10 volt range. This amplitude control is achieved by controllably connecting a selected one of resistors RF-0 through RF-3 in the feedback circuit of amplifier 25 by activating a corresponding one of switching relays A in automatic range control 11. Details of automatic range control 11 are described below.

The amplitude of output E$o$ from amplifier 25 is proportional to current I$in$ developed in network 20. As described above, current I$in$ is related to capacitance C$x$ and possible errors in measuring the value of C$x$ are minimized by obtaining a measurement of the amplitude of current I$in$ at the instant applied ramp signal V$s$ passes a prescribed amplitude level, in this example, zero volts. This measurement of current I$in$ at the zero amplitude value of the applied signal is achieved by employing sample and hold network 27 in conjunction with zero crossing detector 12 and one-shot multivibrator 28.

Accordingly, zero crossing detector 12 responds in well-known fashion to supplied ramp signal V$s$, waveform A, FIG. 3, to generate a pulsating signal as shown in waveform B of FIG. 3. The output from detector 12 is supplied to a trigger input of one-shot 28. One-shot 28 responds in well-known fashion to the leading edge of the pulsating output from detector 12 to generate a pulse output signal as shown in waveform C of the FIG. 3. The pulse output from one-shot 28 is supplied to a trigger input of sample and hold circuit 27. Sample and hold circuit 27 responds to the output from one-shot 28 to sample the amplitude of output E$o$ from amplifier 25 at the instant ramp signal V$s$ crosses zero amplitude. The width of the pulse output from one-shot 28 should be as short a duration as is consistent with the acquisition interval required by sample and hold circuit 27. The shortest possible acquisition interval should be employed to minimize possible errors in the capacitance measurement. A short acquisition interval ensures minimizing any errors caused by current components flowing through resistance R$s$. Any of known sample and hold circuits and one-shot circuits may be equally employed in the instant circuit arrangement.

The sampled value of voltage E$o$ is supplied from the output of sample and hold circuit 27 to meter and readout unit 30 and via circuit path 32 to automatic range control 11. The desired capacitance reading is obtained by multiplying the measured value of E$o$ by the feedback range of amplifier 25. For example, with resistor RF-0 connected in the feedback path of amplifier 25 the reading obtained in meter 30 is multiplied by 1000, while with resistor RF-3 in the feedback circuit, the meter reading is multiplied by 1. Obviously, the measurement ranges may be selected or adjusted as desired. Moreover, if a so-called floating decimal-readout unit is employed, a direct reading of the measured capacitance value may be obtained in well-known fashion.

The gain range of amplifier 25 is controlled by employing automatic range control 11. Range control 11 responds to the square-wave output from generator 10 and the output from sample and hold circuit 27 to generate signals for controllably inserting an appropriate one of resistors RF-0 through RF-3 into the feedback circuit path of amplifier 25 by enabling a corresponding one of switching devices A0 through A3. Additionally, range control 11 generates visual indications of the particular amplitude range of amplifier 25 and whether the output from amplifier 25 is outside the measurement range, i.e., over-range or under-range.

Accordingly, the output from sample and hold circuit 27, representative of the sampled value of E$o$, is supplied to window comparator 33 of range control 11. Comparator 33 is employed to generate signals representative of whether output E$o$ is within a desired voltage range, in this example, 1 to 10 volts, over-range, i.e., above 10 volts, or under-range, i.e., below 1 volt. Comparator 33 includes differential amplifiers 34 and 35, inverters 36 and 37 and NAND gate 38. Output E$o$ is supplied from sample and hold circuit 27 via circuit path 32 and isolation or limiting resistors 39 and 40 to the noninverting inputs of amplifiers 34 and 35, respectively. First reference potential + VR1, representative of the lower limit of the desired voltage window, is supplied to the inverting input of amplifier 34. Second reference potential + VR2, representative of the upper limit of the desired voltage window, is supplied to the inverting input of amplifier 35. The lower and upper limits of the desired voltage window may be set at any desired values corresponding to a desired voltage range, in this example, VR1 = +1 volt and VR2 = +10 volts.

Operation of comparator 33 is believed straight-forward. For values of E$o$ between 1 and 10 volts the output from amplifier 34 is a potential representative of a high state while the output from amplifier 35 is a potential representative of a low state. When E$o$ is below 1 volt the outputs from amplifiers 34 and 35 are low state signals. When E$o$ is above 10 volts the outputs from amplifiers 34 and 35 are high state signals. The output from amplifier 34 is supplied to a first input of NAND gate 38 and via inverter 36 to a first input of NAND gate 42. The output from amplifier 35 is supplied to a first input of NAND gate 38 and via inverter 37 to a second input of NAND gate 38. The output from NAND gate 38 is supplied to a first input of NAND gate 45. Outputs from amplifiers 34 and 35 are operative to cause NAND gate 38 to be in a low state when the magnitude of E$o$ is within the desired 1 to 10 volt range and to be in a high state when the magnitude of E$o$ is below or above the 1 to 10 volt range. Consequently, NAND gate 45 is responsive to the output from NAND gate 38 to be disabled when E$o$ is within range and to be enabled when E$o$ is out of range.

The square-wave output from generator 10, as shown in waveform D of FIG. 3, is supplied to a second input of NAND gate 45. When enabled NAND gate 45 is operative to supply the square-wave signal to counter 46. Counter 46 is a binary coded decimal (BCD) counter arranged to count from 0 through 3 and to reset to a zero count after a count of four. Outputs A and B from counter 46 are supplied to inputs A and B of BCD-to-decimal converter 48. Converter 48 responds in well-known fashion to the outputs of counter 46 to yield an output representative of the count of counter 46. In this example, converter 48 yields a low state signal at one of outputs 0 through 3 corresponding to the count in counter 46. As the count in counter 46 advances, the low state output of converter 48 advances in sequence.

In turn, outputs 0 through 3 from converter 48 are supplied via inverters 49-0 through 49-3 and limiting resistors 50-0 through 50-3 to the base terminals of transistors 51-0 through 51-3, respectively. The output from inverter 49-0 is also supplied to a second input of NAND gate 43 while the output from inverter 49-3 is also supplied to a second input of NAND gate 42. The output from NAND gate 43 is connected in circuit with limiting resistor 52 and light emitting diode (LED) 53. In turn, LED 53 is connected to direct current potential source V. The magnitude and polarity of potential V is such to cause LED 53 to emit a desired light level when the output of NAND gate 43 is in a low state. Similarly, the output of NAND gate 42 is connected in circuit with a series connection of limiting resistor 54 and LED 55. LED 55 is also connected to source V and is effective to emit a desired light level when the output of NAND gate 42 is in a low state.

The emitters of transistors 51-0 through 51-3 are connected to a reference potential point, namely, ground potential. The collector terminals of transistors 51-0 through 51-3 are connected in one-to-one circuit relationship with a first terminal of relays A0 through A3, respectively. Second terminals of relays A0 through A3 are connected to source V. Relays A0 through A3 are each shunted by a series connection of a limiting resistor and LED, namely, resistors 56-0 through 56-3 connected in series with LEDs 57-0 through 57-3, respectively.

Transistors 51 are operative, in response to a positive output from corresponding ones of inverters 49, to connect the first terminal of associated ones of relays A to ground potential. Thus, when one of transistors 51 is gated ON a corresponding one of relays A is caused to operate, thereby connecting the corresponding one of resistors RF-0 through RF-3 in the feedback circuit of amplifier 25. This causes the gain of amplifier 25 to be adjusted to a level corresponding to the enabled one of relays A. Additionally, the LED shunting the enabled relay is caused to emit a desired light level. In this manner, a visual indication of the gain range of amplifier 25 is realized.

Thus, automatic range control 11 operates to connect an appropriate one of resistors RF-0 through RF-3 in the feedback circuit of amplifier 25 so that the amplitude of output E$o$ is controlled to be within the desired 1 to 10 volt range. In summary, this control is achieved by supplying the sampled value of E$o$ to window comparator 33. Comparator 33 yields output signals indicative of whether E$o$ is within range, too low or too high. If E$o$ is initially low or high, a high state signal is developed at the output of NANd gate 38 which enables NAND gate 45 to supply the square-wave output from generator 10 (waveform D of FIG. 3) to counter 46. The square-wave signal is out of phase with the ramp signal (waveform A of FIG. 3) so that automatic range control is achieved after E$o$ has been sampled. Counter 46 in conjunction with converter 48 generates signals in response to the supplied square-wave signal for scanning gain ranges of amplifier 25. This range scanning is achieved by sequentially enabling relays A0 through A3, thereby sequentially inserting resistors RF-0 through RF-3 in the feedback circuit of amplifier 25. Once E$o$ is brought within range, NAND gate 38 of the comparator 33 yields a low state signal which, in turn, disables NAND gate 45 and the count of counter 46 is frozen. The output from converter 48 remains in a state which corresponds to the count in counter 46. Consequently, the one of relays A corresponding to the output of converter 48 remains enabled, fixing the gain of amplifier 25 until E$o$ is again outside the desired 1 to 10 volt range.

If the amplitude of E$o$ cannot be adjusted to be within the desired range, a visual indication of such condition is obtained by either LED 53 or LED 55 being illuminated. When E$o$ is under-range and cannot be adjusted within range, the output of inverter 36 is a high state signal and the output from inverter 49-3 is periodically in a high state, thereby causing NAND gate 42 to yield a periodic low state signal at its output. This low state output from gate 42 causes LED 55 to be periodically illuminated. Similarly, when E$o$ is over-range and cannot be adjusted within range, the output from amplifier 35 is a high state signal and the output from inverter 49-0 is periodically a high state signal, thereby causing NAND gate 43 to yield a periodic low state signal at its output. This low state output from gate 43 causes LED 53 to be illuminated, yielding an indication that Eo is over-range.

The above described arrangement is, of course, merely illustrative of the application of the principles of the invention. Numerous other arrangements may be devised by those skilled in the art without departing from the spirit and scope of the invention. For example, although the above described technique is disclosed in an arrangement for obtaining a measure of capacitance of a network-under-evaluation, the technique is equally applicable for obtaining a more accurate measure of inductance of a network. As is well known, there is a certain duality between capacitance and inductance measurement. It is also known that $$EL = EL \frac{dIs}{dt}. \quad (9)$$

Thus, a more accurate measure of inductance of a network including additional impedance components is realizable by supplying a ramp current signal Is of known slope $m=dIs/dt$ to the network, detecting a prescribed amplitude value of the ramp current, namely, zero amplitude, and measuring the amplitude of voltage EL developed across the network at the instant current Is attains the prescribed amplitude value. The measured value of voltage EL is then employed to compute the desired inductance value.

What is claimed is:

1. In apparatus for measuring the capacitance value of a network-under-evaluation of the type employing a periodic ramp signal which is applied to the network and means for sampling and holding the value of current developed in the network at the instant that the ramp signal passes through a prescribed amplitude value, apparatus for obtaining range control of a signal representative of the capacitance value comprising, controllable means in circuit relationship with the network-under-evaluation and said sampling and holding means for generating an output signal proportional to the amplitude of the current developed in the network-under-evaluation, said controllable means including means for adjusting the amplitude of said output signal to be within a predetermined voltage range and means for generating signals to control said adjusting means to effect range control.

2. Apparatus as defined in claim 1 wherein said controllable means includes an amplifier having an input and an output, the input being in circuit relationship with the network-under-evaluation and the output being in circuit relationship with said sample and hold means, said amplitude adjusting means being connected in circuit between the input and output of said amplifier means and including a plurality of resistor means and a plurality of switching means connected in predetermined circuit relationship, said switching means being responsive to said control signals to insert corresponding ones of said resistor means in circuit between the input and the output of said amplifier means, wherein said resistor means have predetermined resistance values selected so that the gain of said amplifier means is adjusted thereby effecting a corresponding adjustment in the amplitude of said output signal.

3. The apparatus as defined in claim 2 wherein said control signal generating means includes comparator means in circuit relationship with said sample and hold means for generating predetermined signals representative of whether the sampled amplitude of said output signal is in or out of a prescribed voltage range, counter means, means responsive to a signal from said comparator means for controlling the supply of a periodic pulsating signal having a predetermined time period substantially equal to but out of phase with that of said ramp signal to said counter means, and means responsive to signals developed at outputs of said counter means for generating said control signals in a predetermined sequence to effect sequential gain adjustment of said amplifier means.

* * * * *